(12) United States Patent
Ikedo et al.

(10) Patent No.: US 7,747,230 B2
(45) Date of Patent: Jun. 29, 2010

(54) TRANSMISSION MODULATION APPARATUS (75) Inventors: Taichi Ikedo, Kanagawa (JP); Kaoru Ishida, Osaka (JP)

(73) Assignee: Panasonic Corporation, Osaka (JP)

( * ) Notice: Subject to any disclaimer, the term of this patent is extended or adjusted under 35 U.S.C. 154(b) by 546 days.

(21) Appl. No.: 11/750,640

(22) Filed: May 18, 2007

(65) Prior Publication Data

US 2007/0281637 A1    Dec. 6, 2007

(30) Foreign Application Priority Data

May 22, 2006  (JP) ............................. 2006-142103
May 14, 2007  (JP) ............................. 2007-128231

(51) Int. Cl.
*H04B 1/04* (2006.01)
*H04K 3/00* (2006.01)

(52) U.S. Cl. .................................... 455/126; 455/127.1

(58) Field of Classification Search ................. 455/126, 455/127.1–127.3; 330/10, 107, 136, 296, 330/297

See application file for complete search history.

(56) References Cited

U.S. PATENT DOCUMENTS

| 6,043,707 | A * | 3/2000 | Budnik ........................ 330/10 |
| 7,110,730 | B2 | 9/2006 | Okada et al. |
| 2005/0118965 | A1 | 6/2005 | Tanabe et al. |

2006/0159198 A1    7/2006   Morimoto et al.

FOREIGN PATENT DOCUMENTS

| JP | 2003/018026 | 1/2003 |
| JP | 2004007434 | 1/2004 |
| JP | 2005/167541 | 6/2005 |
| WO | 2005/104352 | 11/2005 |

OTHER PUBLICATIONS

International Search Report dated Aug. 21, 2007.
International Search Report dated May 22, 2006.
International Search Report dated Jun. 6, 2007.

\* cited by examiner

*Primary Examiner*—Lee Nguyen
(74) *Attorney, Agent, or Firm*—Dickinson Wright PLLC (57) ABSTRACT A transmission modulation apparatus capable of dealing with characteristic variations of a high-frequency power amplifier without always forming an amplitude loop. Transmission modulation apparatus 100 is configured with level detector 140 that receives input of a level detection control signal and detects the output signal of high-frequency power amplifier 130, and offset voltage correcting section 150 that corrects an offset voltage using collinear approximation including a first point where the relationship between the power supply voltage value and the output voltage starts to shift from linear to non-linear based on an output signal of level detector 140 and a second point where output voltage is a minimum. Offset voltage correction is adaptively executed, and linearity between the voltage value of the baseband amplitude signal and the output voltage of high-frequency power amplifier 130 when the voltage value of the baseband amplitude signal is low is compensated.

10 Claims, 10 Drawing Sheets

RELATED ART

FIG.1

RELATED ART

FIG.2

RELATED ART

TRANSMISSION MODULATION APPARATUS

CROSS REFERENCE TO RELATED APPLICATIONS

The disclosure of Japanese Patent Application No. 2006-142103 filed on May 22, 2006 and No. 2007-128231 filed on May 14, 2007 including the specification, drawings and abstract is incorporated herein by reference in its entirety.

BACKGROUND OF THE INVENTION

1. Field of the Invention

The present invention relates to a transmission modulation apparatus, and more particularly, a transmission modulation apparatus to which a polar modulation scheme is applied.

2. Description of the Related Art

In the design of a transmission modulation apparatus of the related art, there is typically a trade off relationship between efficiency and linearity. However, recently, a technique has been proposed that is capable of realizing both high efficiency and linearity in the transmission modulation apparatus as a result of using polar modulation.

Figure 1:
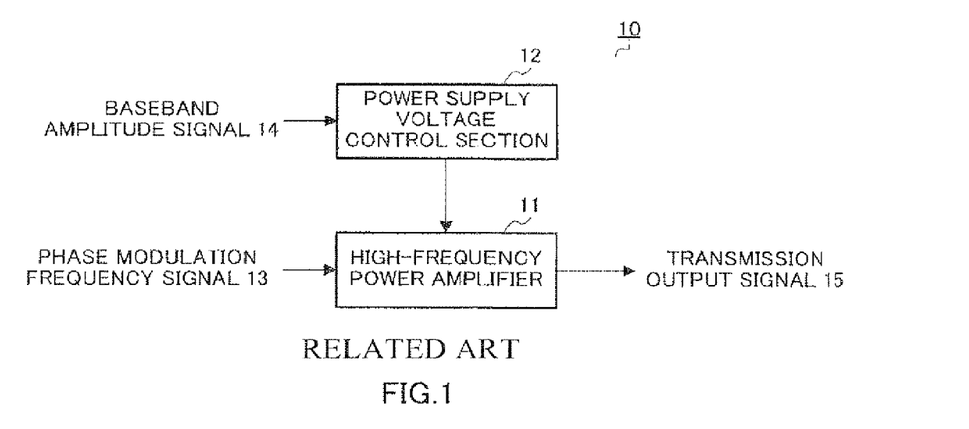
FIG. 1 is a block diagram showing a configuration example of a transmission modulation apparatus of the related art to which polar modulation is applied.

FIG. 1 is a block diagram showing a configuration example of a transmission modulation apparatus to which polar modulation is applied.

In FIG. 1, transmission modulation apparatus 10 is provided with high-frequency power amplifier 11 that amplifies phase-modulated high-frequency signals, and power supply voltage control section 12 that controls a power supply voltage of high-frequency power amplifier 11 based on a baseband amplitude signal.

Phase-modulated high-frequency signal 13 is inputted to high-frequency power amplifier 11, and baseband amplitude signal (for example, $\sqrt{(I^2+Q^2)}$) 14 generated from a baseband signal by amplitude/phase data generating section (not shown) is inputted to power supply voltage control section 12.

Phase-modulated high-frequency signal 13 is obtained by first generating a phase component (for example, an angle between a modulation symbol and an I axis) of the baseband signal by the amplitude/phase data generating section (not shown), and then modulating a carrier frequency signal using the phase component. Further, the power supply voltage formed by power supply voltage control section 12 is supplied to high-frequency power amplifier 11.

By this means, transmission output signal 15 obtained by amplifying a signal in which a power supply voltage value is multiplied by phase modulation high-frequency signal 13, by the amount corresponding to gain of high-frequency power amplifier 11, is outputted from high-frequency power amplifier 11. Transmission output signal 15 is transmitted from an antenna (not shown).

By using a polar modulation scheme in this way, it is possible to take phase-modulated high-frequency signal 13 inputted to high-frequency power amplifier 11 as a constant envelope signal which does not have a fluctuation component in an amplitude direction, so that it is possible to use a high-efficiency non-linear amplifier as high-frequency power amplifier 11.

However, with this kind of the polar modulation scheme, it is required that there is a proportional relationship between a voltage value of baseband amplitude signal 14 and an output voltage of high-frequency power amplifier 11 (typically obtained by converting the output power to a voltage applied to 50Ω).

As a device used for high-frequency power amplifier 11, it is often the case that an HBT (Hetro-junction Bipolar Transistors) device that gives higher gain than an FET device and can be made small easily is used. However, the HBT device has a specific parameter, which is referred to as an offset voltage, between the power supply voltage value and the output voltage.

Figure 2:
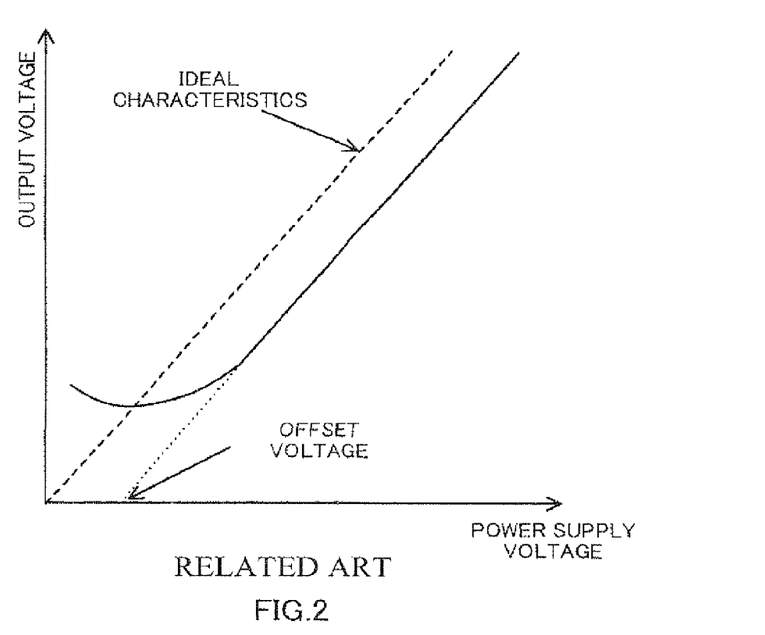
FIG. 2 shows a relationship between a power supply voltage value and an output voltage when an HBT device is used as a high-frequency power amplifier of the transmission modulation apparatus of the related art.

FIG. 2 shows a relationship between the power supply voltage value and the output voltage when the HBT device is used as high-frequency power amplifier 11. As shown in FIG. 2, it can be understood that the power supply voltage and the output voltage change linearly, but this line does not pass through the origin, and therefore there is no proportional relationship. An offset voltage is required when the HBT device is used as high-frequency power amplifier 11. The offset voltage is a power supply voltage value when the output rises. In FIG. 2, the relationship between the power supply voltage value and the output voltage is made collinear approximation, and the intersection point of this line and the x axis is defined as an offset voltage.

In the polar modulation scheme, power supply voltage control section 12 avoids distortion by adding the above-described offset voltage to baseband amplitude signal 14 and performing correction so that there is a proportional relationship between the voltage value and the output voltage of baseband amplitude signal 14. In FIG. 2, when the slope changes, only the gain of the output voltage with respect to the power supply voltage value changes, and therefore distortion does not occur.

However, the relationship between the power supply voltage and the output voltage of the high-frequency power amplifier changes according to the input power and characteristic variations of the high-frequency power amplifier, and therefore the offset voltage also changes along with this. In particular, a region where the power supply voltage value is low is strongly susceptible to the influence of leakage of the high-frequency power amplifier. In FIG. 2, non-linear portions of the output voltage indicate the influence of leakage when the power supply voltage is low. The leakage amount of the high-frequency power amplifier is decided by parasitic capacitance of the devices, or the like, and therefore is susceptible to the influence of characteristic variations, and non-linear factors increase.

A region where the power supply voltage value is low corresponds to the case where a voltage value of the baseband amplitude signal is small. In the region, the proportion of the offset voltage increases, and therefore the characteristic is easily influenced. Because of this, there is a problem that, if the relationship between the power supply voltage and the output voltage is made collinear approximation and correction is performed using the offset voltage obtained from the intersection point of the line and an x axis, it is not possible to obtain sufficient effects.

Therefore, Patent Document 1 (Japanese Patent Application Laid-Open No. 2004-7434) discloses a technique of compensating linearity between a voltage value and an output voltage of a baseband amplitude signal by monitoring an output of a high-frequency power amplifier.

Figure 3:
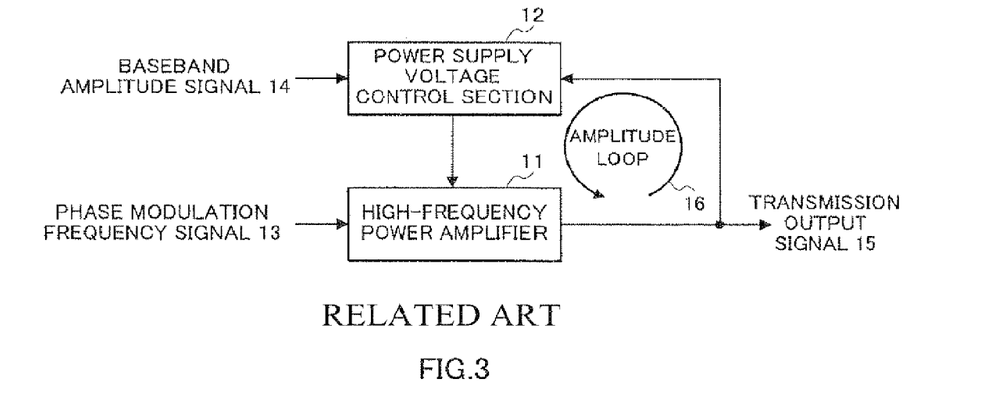
FIG. 3 is a block diagram showing a configuration example of a transmission modulation apparatus of the related art dealing with characteristic variations of the high-frequency power amplifier by forming an amplitude loop.

FIG. 3 is a block diagram showing a configuration example of a transmission modulation apparatus of the related art dealing with characteristic variations of a high-frequency power amplifier by forming an amplitude loop. Components that are the same as those in FIG. 1 will be assigned the same reference numerals. As shown in FIG. 3, amplitude loop 16 is always formed for monitoring the output of high-frequency power amplifier 11 and setting power supply voltage values corresponding to characteristic variations of the high-frequency power amplifier, and compensates the linearity between the voltage value and the output voltage of the baseband amplitude signal.

However, with such a transmission modulation apparatus of the related art, the amplitude loop is always formed as shown in FIG. 3, and therefore the circuit configuring the amplitude loop is required to have high linearity and wide band characteristics. As a result, there is a problem that a circuit scale and cost increase, and loop operation cannot be followed when the modulation speed becomes a high speed.

Further, when the power supply voltage is low as shown in FIG. 2, non-linear portions occur due to the influence of leakage of the high-frequency power amplifier. The collinear approximation is not enough for the non-linear portions, and therefore a method of performing compensation by storing all characteristics and reading out the characteristics is adopted. This is the same on the phase side. It goes without saying that an increase in the amount of used memory leads to an increase in cost. In addition, it is necessary to always execute operation by the amplitude loop as described above at non-linear portions where the power supply voltage is low. If appropriate correction is not carried out at non-linear portions, the characteristics shift from the ideal characteristics, and the shifted portion appears as a distortion component. In this case, the problem is influence on adjacent channels, and the influence is strictly defined by the specification.

SUMMARY OF THE INVENTION

It is therefore an object of the present invention to provide a transmission modulation apparatus capable of dealing with characteristic variations of a high-frequency power amplifier without always forming an amplitude loop.

According to an aspect of the invention, a transmission modulation apparatus adopts a configuration including: an amplitude/phase data generating section that generates a baseband amplitude signal and a baseband phase signal; a phase modulator that phase-modulates a high-frequency signal using the baseband phase signal; a high-frequency power amplifier that amplifies an output signal of the phase modulator based on an output signal from a power supply voltage control section; a level detector that detects an output signal level of the high-frequency power amplifier; the power supply voltage control section that calculates a power supply voltage value for controlling a power supply voltage of the high-frequency power amplifier based on the baseband amplitude signal, adds a predetermined offset voltage to the power supply voltage value, and outputs the result as an output signal; a determining section that determines from execution conditions whether or not offset voltage correction for correcting the offset voltage is performed; and an offset voltage correcting section that corrects the offset voltage based on the output signal level of the level detector when the offset voltage correction is determined to be performed by the determining section from the execution conditions.

According to another aspect of the invention, transmission modulation apparatus adopts a configuration including: an amplitude/phase data generating section that generates a baseband amplitude signal and a baseband phase signal; a phase modulator that phase-modulates a high-frequency signal using the baseband phase signal; a high-frequency power amplifier that amplifies an output signal of the phase modulator; a power supply voltage control section that controls a power supply voltage of the high-frequency power amplifier based on the baseband amplitude signal; a phase detector that detects a phase of an output signal level of the high-frequency power amplifier; a determining section that determines from execution conditions whether or not phase correction for correcting a phase of the baseband phase signal is performed; and a phase correcting section that corrects the phase of the baseband phase signal based on an output signal of the phase detector when the phase correction is determined to be performed by the determining section from the execution conditions.

DETAILED DESCRIPTION OF THE PREFERRED EMBODIMENTS

Embodiments of the present invention will be described in detail below with reference to the accompanying drawings.

Embodiment 1

Figure 4:
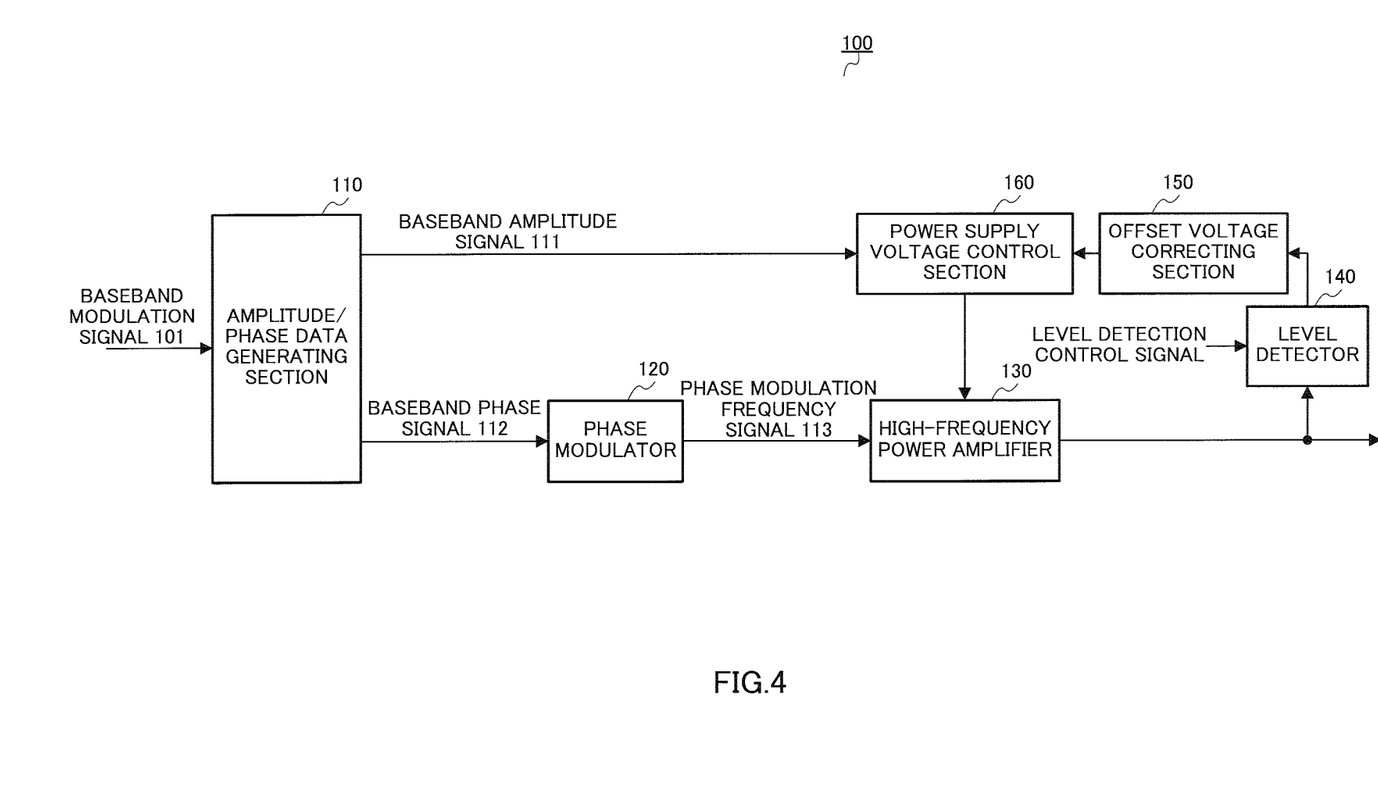
FIG. 4 is a block diagram showing a configuration of a transmission modulation apparatus according to Embodiment 1 of the present invention.

FIG. 4 is a block diagram showing a configuration of the transmission modulation apparatus according to Embodiment 1 of the present invention. This embodiment is an example using an HBT in the high-frequency power amplifier.

In FIG. 4, transmission modulation apparatus 100 is provided with: amplitude/phase data generating section 110 that generates a baseband amplitude signal and a baseband phase signal; phase modulator 120 that phase-modulates a high-frequency signal using the baseband phase signal; high-frequency power amplifier 130 that amplifies an output signal of phase modulator 120; level detector 140 that detects the output signal level of high-frequency power amplifier 130; offset voltage correcting section 150 that corrects an offset voltage added by power supply voltage control section 160 based on an output signal of level detector 140; and power supply voltage control section 160 that controls a power supply voltage of high-frequency power amplifier 130 based on the baseband amplitude signal.

Amplitude/phase data generating section 110 generates baseband amplitude signal 111 which is an amplitude component (for example, $\sqrt{(I^2+Q^2)}$) and baseband phase signal 112 which is a phase component (for example, an angle between a modulation symbol and an I axis) from baseband modulation signal 101.

Phase modulator 120 phase-modulates a high-frequency signal using baseband phase signal 112 and converts the high-frequency signal to phase-modulated high-frequency signal 113.

High-frequency power amplifier 130 is configured with the HBT device, and amplitude-modulates phase-modulated high-frequency signal 113 which is the output signal of phase modulator 120 using an output signal of power supply voltage control section 160.

Level detector 140 monitors the output signal level of high-frequency power amplifier 130 based on a level detection control signal. The level detection control signal is a trigger signal for determining whether or not offset voltage correction is performed from execution conditions. In this embodiment, when level detector 140 receives input of the level detection control signal, the output signal level of high-frequency power amplifier 130 is detected. The level detection control signal may be inputted independently from the following two systems, or may be inputted in combination.

(1) Temperature change of high-frequency power amplifier 130: The power amplifier configuring high-frequency power amplifier 130 is susceptible to the influence of temperature, and therefore provided with temperature compensation by a temperature compensation section. A temperature detecting method by the temperature compensation section includes a case where a temperature sensor is provided near the power amplifier and a method of estimating relative temperature from a current value, or the like of a transistor configuring the temperature compensation section incorporated in the power amplifier. In this embodiment, when the temperature change of the power amplifier changes by more than a predetermined amount, a level detection control signal is outputted to level detector 140.

(2) Change in use conditions: A level detection control signal is outputted to level detector 140 in accordance with usage time, energized time or the power supply timing of transmission modulation apparatus 100. In this embodiment, a level detection control signal is outputted every predetermined usage time and upon activation of transmission modulation apparatus 100.

Further, when level detector 140 receives input of the level detection control signal, level detector 140 detects the output voltage where the output signal level of high-frequency power amplifier 130 is less than a predetermined voltage, and, in particular, the relationship between the power supply voltage value and the output voltage starts to shift from linear to non-linear.

Offset voltage correcting section 150 corrects the offset voltage added by power supply voltage control section 160 based on the output signal of level detector 140. Specifically, offset voltage correcting section 150 corrects the offset voltage through collinear approximation including a first point where the relationship between the power supply voltage and the output voltage starts to shift from linear to non-linear and a second point where the output voltage is a minimum.

Power supply voltage control section 160 calculates a power supply voltage value for controlling a power supply voltage of high-frequency power amplifier 130 based on baseband amplitude signal 111, adds the offset voltage corrected by offset voltage correcting section 150 to the calculated power supply voltage value and outputs the result as an output signal.

Hereinafter, operation of the transmission modulation apparatus configured as described above will be described.

Baseband amplitude signal 111 and baseband phase signal 112 are generated from baseband modulation signal 101 by amplitude/phase data generating section 110. Baseband phase signal 112 is inputted to phase modulator 120, and baseband amplitude signal 111 is inputted to power supply voltage control section 160. The power supply voltage formed by power supply voltage control section 160 is then supplied to high-frequency power amplifier 130. In this way, a signal obtained by amplifying a signal in which a power supply voltage value is multiplied by phase-modulated high-frequency signal 113, by the amount corresponding to gain of high-frequency power amplifier 130, is outputted from high-frequency power amplifier 130.

Level detector 140 detects the output level of high-frequency power amplifier 130 when specified by the level detection control signal. Specifically, when a power supply voltage based on baseband amplitude signal 111 is inputted from power supply voltage control section 160 to high-frequency power amplifier 130, an output voltage corresponding to a root-mean-square value of the power supply voltage is detected. Offset voltage correcting section 150 corrects the offset voltage added by power supply voltage control section 160 based on the output signal of level detector 140.

As described above, it is not until input of the level detection control signal is received that level detector 140 detects the output signal level of high-frequency power amplifier 130, and therefore the output signal level of high-frequency power amplifier 130 is not detected if the level detection control signal is not inputted, and offset voltage correction is therefore also not carried out by offset voltage correcting section 150. Namely, an offset voltage correction loop from "high-frequency power amplifier 130-level detector 140-offset voltage correcting section 150-power supply voltage control section 160" is not formed.

First, the offset voltage correction operation will be described for the case where the level of baseband amplitude signal 111 is relatively large, that is, in a region where the relationship between the power supply voltage value and the output voltage of high-frequency power amplifier 130 can be substantially regarded as a straight line.

Figure 5:
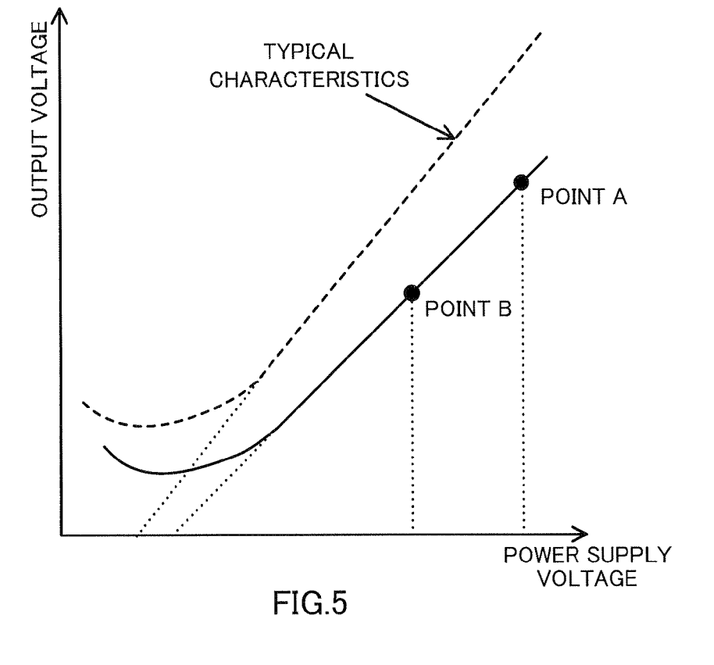
FIG. 5 illustrates offset voltage correction operation for the case where a baseband amplitude signal of the transmission modulation apparatus according to Embodiment 1 is relatively large.
Figure 6:
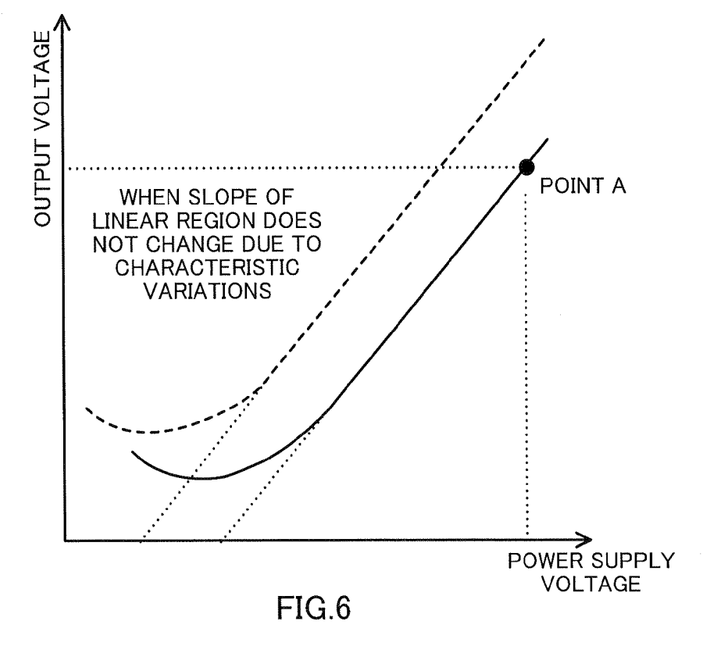
FIG. 6 illustrates simple offset voltage correction operation for the case where the baseband amplitude signal of the transmission modulation apparatus according to Embodiment 1 is relatively large.

FIG. 5 illustrates offset voltage correction operation when the baseband amplitude signal is relatively large, and FIG. 6 illustrates simple offset voltage correction operation for the case where the baseband amplitude signal is relatively large.

In FIG. 5, when a power supply voltage based on baseband amplitude signal 111 is inputted from power supply voltage control section 160 to high-frequency power amplifier 130, level detector 140 detects an output voltage corresponding to a root-mean-square value of the power supply voltage (refer to point A in FIG. 5), and, when a power supply voltage based on baseband amplitude signal 111 of a different level from that for detecting point A is inputted, level detector 140 detects an output voltage corresponding to a root-mean-square value of the power supply voltage. Offset voltage correcting section 150 obtains a slope from information of two points, calculates an offset voltage to be corrected and corrects the offset voltage set at power supply voltage control section 160.

Here, for simplicity, the case is assumed where a slope of a line indicating a relationship between a power supply voltage value and an output voltage of a high-frequency power amplifier is calculated from information of two points. However, when a device where the slope of the line changes little due to characteristic variations is used, as shown in FIG. 6, by comprehending in advance typical characteristics (refer to the dotted line in FIG. 6) indicating the relationship between the power supply voltage value and the output voltage of high-frequency power amplifier 130 and detecting the extent to which information of one point shifts from typical characteristics, it is possible to calculate the offset voltage to be corrected from the slope of the line.

In this way, in a region where a relationship between the power supply voltage value and the output voltage of high-frequency power amplifier 130 can be substantially regarded as a line, it is only necessary to carry out correction taking a point where the slope of the line is extrapolated as a power supply voltage offset voltage.

Next, the offset voltage correction operation will be described for the case where the level of baseband amplitude signal 111 is relatively small, that is, in a region where the relationship between the power supply voltage value and the output voltage of high-frequency power amplifier 130 starts to shift from the straight line.

The region where the power supply voltage is low is strongly susceptible to the influence of leakage of the high-frequency power amplifier and becomes non-linear. A characteristic of this embodiment is that, in a non-linear region where the power supply voltage is low, the offset voltage is corrected.

Figure 7:
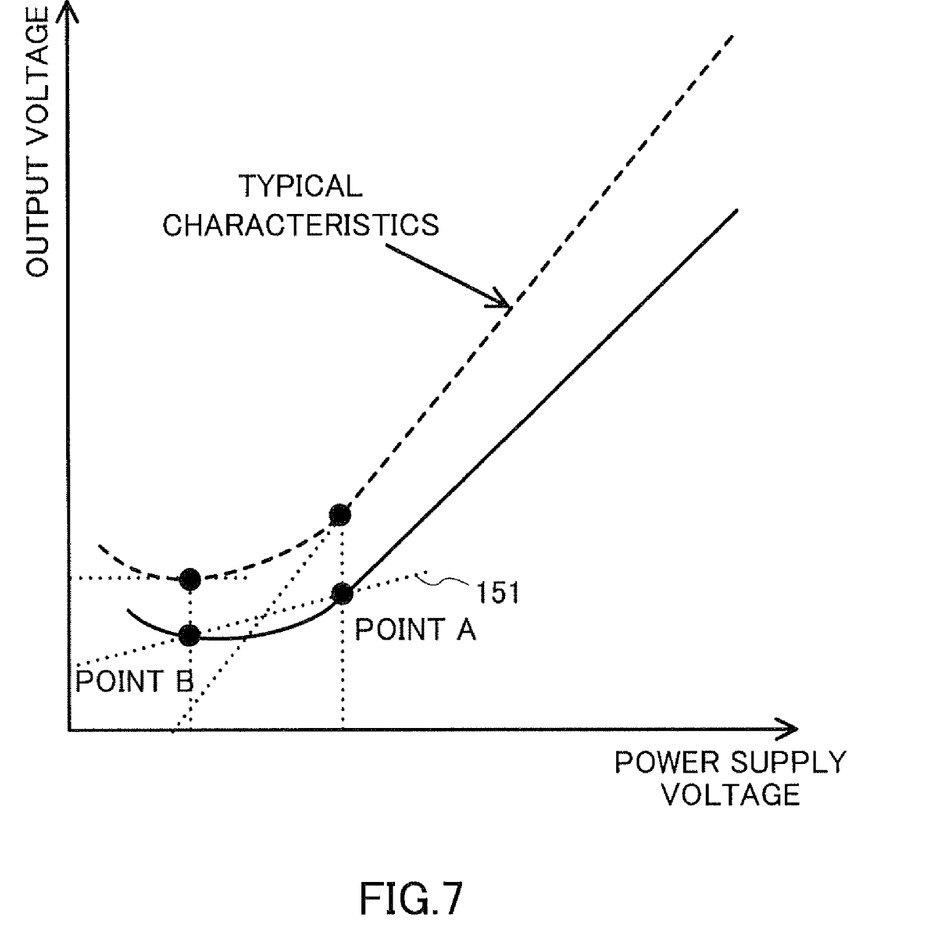
FIG. 7 illustrates offset voltage correction operation for the case where the baseband amplitude signal of the transmission modulation apparatus according to Embodiment 1 is relatively small.

FIG. 7 illustrates offset voltage correction operation for the case where the baseband amplitude signal is relatively small.

For correction for the case where the level of baseband amplitude signal 111 is relatively small, a slope is obtained from a point (refer to point A in FIG. 7) where the relationship between the power supply voltage value and the output voltage starts to shift from a line (linear) to non-linear and a point (refer to point B in FIG. 7) where the output voltage is a minimum, and an offset voltage to be corrected is calculated using line 151 (dashed line) including these two points. The point where the output voltage is a minimum corresponds to the leakage amount of high-frequency power amplifier 130. Power supply voltage values for high-frequency power amplifier 130 corresponding to these two points are set assuming typical characteristics (refer to the dashed line in FIG. 7) indicating the relationship between the power supply voltage value and the output voltage, and based on the fact that the baseband amplitude signal corresponding to the power supply voltage value is inputted.

Level detector 140 detects the output voltage corresponding to the power supply voltage where the relationship between the power supply voltage value and the output voltage of high-frequency power amplifier 130 shifts from the line (refer to point A in FIG. 7), and further detects the output voltage corresponding to the power supply voltage where the output voltage is a minimum (refer to point B in FIG. 7). The power supply voltage where the relationship between the power supply voltage value and the output voltage starts to shift from a line, and the power supply voltage when the output voltage is a minimum are set from the typical characteristics.

Offset voltage correcting section 150 obtains the slope of line 151 from information of the two points A and B, calculates an offset voltage to be corrected (negative value in FIG. 7), and corrects the offset voltage set at power supply voltage control section 160.

In this way, by measuring a leakage amount of high-frequency power amplifier 130, it is possible to compensate linearity with the output voltage, in particular, when the power supply voltage value is low. An example has been given where both point A and point B are extracted from a region where the relationship between the power supply voltage value and the output voltage of high-frequency power amplifier 130 is non-linear, but, when the level of baseband amplitude signal 111 is a level that extends over a region where the relationship between the power supply voltage value and the output voltage of high-frequency power amplifier 130 is linear and a region where the relationship is non-linear, the output voltage of the linear region is detected as point A, the output voltage of the non-linear region is extracted as point B, and the offset voltage to be corrected may be calculated using the line including these two points.

Here, the case has been described as an example where the output voltage when baseband amplitude signal 111 is inputted to high-frequency power amplifier 130 from power supply voltage control section 160 is detected, but it is not necessary to input baseband amplitude signal 111, and it is also possible to perform correction in a similar way by inputting a fixed voltage (such as a DC power supply voltage). Further, the slope is obtained from information of two points, but it is also possible to achieve compensation more accurately in accordance with an increase in the number of detecting points. In this case, it is preferable to perform approximation using a regression line. If correction is performed once, further correction is not necessary unless the use conditions of transmission modulation apparatus 100 change. Namely, if correction is performed when transmission modulation apparatus 100 is shipped as a product, correction is not necessary as long as transmission modulation apparatus 100 is used based on the use conditions for the time of product shipment. In other words, if this correction processing is executed immediately before transmission modulation apparatus 100 is used (for example, upon supplying power), it is possible to perform correction even if characteristics of high-frequency power amplifier 130 fluctuate due to the change in the use conditions (for example, temperature change).

As described above, according to this embodiment, transmission modulation apparatus 100 is configured with: level detector 140 that receives input of a level detection control signal and detects the output signal level of high-frequency power amplifier 130; and offset voltage correcting section 150 that corrects an offset voltage based on an output signal of level detector 140 through collinear approximation including a first point where the relationship between the power supply voltage value and the output voltage starts to shift from linear to non-linear and a second point where the output voltage is a minimum, so that it is possible to adaptively correct the offset voltage using level detector 140 which receives input of the level detection control signal, and compensate linearity between a voltage value of a baseband amplitude signal and an output voltage of high-frequency power amplifier 130 when the voltage value of the baseband amplitude signal is low by offset voltage correcting section 150. As a result, it is possible to implement a transmission modulation apparatus capable of dealing with characteristic variations of high-frequency power amplifier 130 using the HBT device without always forming an amplitude loop.

Further, in this embodiment, the non-linear portions due to the influence of the leakage of high-frequency power amplifier 130 is corrected using the slope of the line from the information of two points, and the offset voltage is calculated. Compared to the example of the related art where compensation is carried out for non-linear portions using a table in which all characteristics are stored in a ROM or the like, the accuracy becomes poor, but the control is simple and the amount of calculation to be corrected substantially decreases.

Further, it is preferable to perform offset voltage correction one time at the product shipment stage. Namely, unless the internal conditions change, the offset voltage correction may be corrected by performing measurement one time initially for one power amplifier. After this, when operation conditions of transmission modulation apparatus 100 (in particular, operation characteristics of high-frequency power amplifier 130) change, the level detection control signal is outputted, and an offset voltage correction loop from "high-frequency power amplifier 130-level detector 140-offset voltage correcting section 150-power supply voltage control section 160" is formed at this time only. For example, this may be implemented when the temperature of the power amplifier configuring high-frequency power amplifier 130 changes, upon start up of every predetermined usage time, or upon supplying power to the terminal.

Embodiment 2

Embodiment 1 applies correction of an output voltage, that is, correction of an offset voltage regarding an amplitude. Embodiment 2 is an example of the case where a phase of a baseband phase signal is corrected using the same concept.

Figure 8:
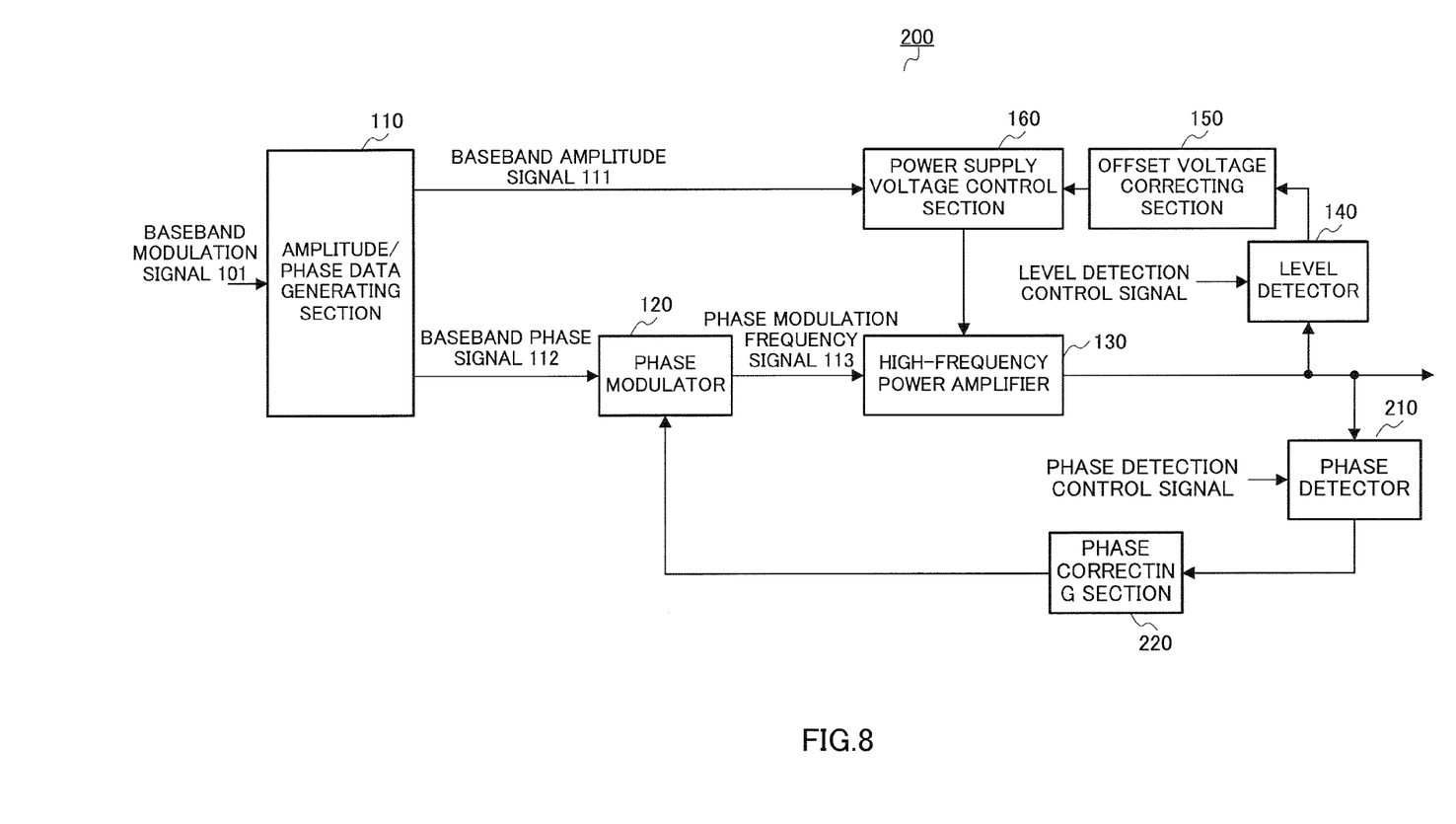
FIG. 8 is a block diagram showing a configuration of a transmission modulation apparatus according to Embodiment 2 of the present invention.

FIG. 8 is a block diagram showing a configuration of the transmission modulation apparatus according to Embodiment 2 of the present invention. Components that are the same as those in FIG. 4 will be assigned the same reference numerals without further explanations.

In FIG. 8, in addition to the configuration of transmission modulation apparatus 100 in FIG. 4, transmission modulation apparatus 200 is configured with phase detector 210 that detects the phase of the output signal of high-frequency power amplifier 130, and phase correcting section 220 that corrects baseband phase signal 112 based on the output signal of phase detector 210.

Phase correcting section 220 applies phase correction to phase modulator 120 based on the output of phase detector 210.

Phase detector 210 detects the output phase of high-frequency power amplifier 130 when specified by the phase detection control signal. The phase detection control signal is a trigger signal for determining whether or not phase correction is performed from execution conditions in the same way as with the level detection control signal described above. In this embodiment, when phase detector 210 receives input of the phase detection control signal, the output signal level of high-frequency power amplifier 130 is detected. In addition to a temperature change of high-frequency power amplifier 130, the phase detection control signal is inputted at the usage time, energized time or the power supply timing. This phase detection control signal may also be used as a level detection control signal. According to this configuration, it is suitable for the case of dealing with characteristic variations of high-frequency power amplifier 130 upon compensating the relationship between the power supply voltage value and the output phase of high-frequency power amplifier 130.

It is required that the relationship between the voltage value of the baseband amplitude signal and the output voltage of the high-frequency power amplifier become proportional. In the same way, it is required that the relationship between the voltage value of the baseband amplitude signal and the output phase of the high-frequency power amplifier be such that the output phase of the high-frequency power amplifier is fixed with respect to the voltage value of the baseband amplitude signal.

Figure 9:
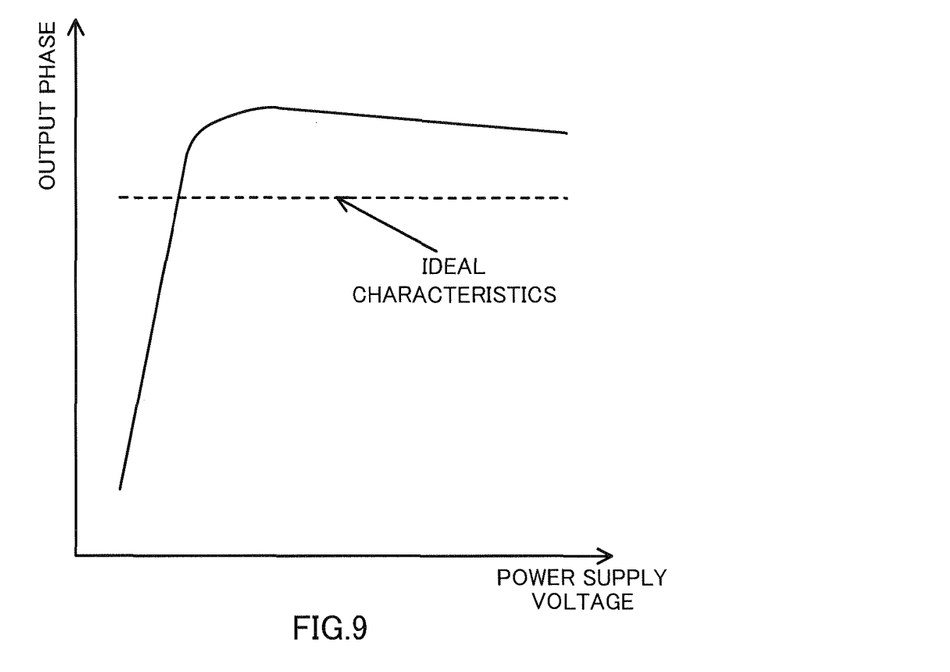
FIG. 9 shows a relationship between a power supply voltage value and an output phase for the case where the HBT device is used as a high-frequency power amplifier of the transmission modulation apparatus according to Embodiment 2.

FIG. 9 shows a relationship between the power supply voltage value and the output phase when the HBT device is used as high-frequency power amplifier 130.

As shown in FIG. 9, it can be understood that the output phase changes rapidly when the power supply voltage value is low.

The relationship between the power supply voltage value and the output phase of high-frequency power amplifier 130 changes according to the input power and characteristic variations of high-frequency power amplifier 130. In particular, a region where the power supply voltage is low is strongly susceptible to the influence of leakage of high-frequency power amplifier 130. The leakage amount of high-frequency power amplifier 130 is decided based on parasitic capacitance of devices, or the like, and therefore is susceptible to the influence of characteristic variations, and non-linear factors increase.

First, the phase correction operation will be described for the case where the level of baseband amplitude signal 111 is relatively large, that is, in a region where the output phase is substantially fixed with respect to the power supply voltage value of high-frequency power amplifier 130.

Figure 10:
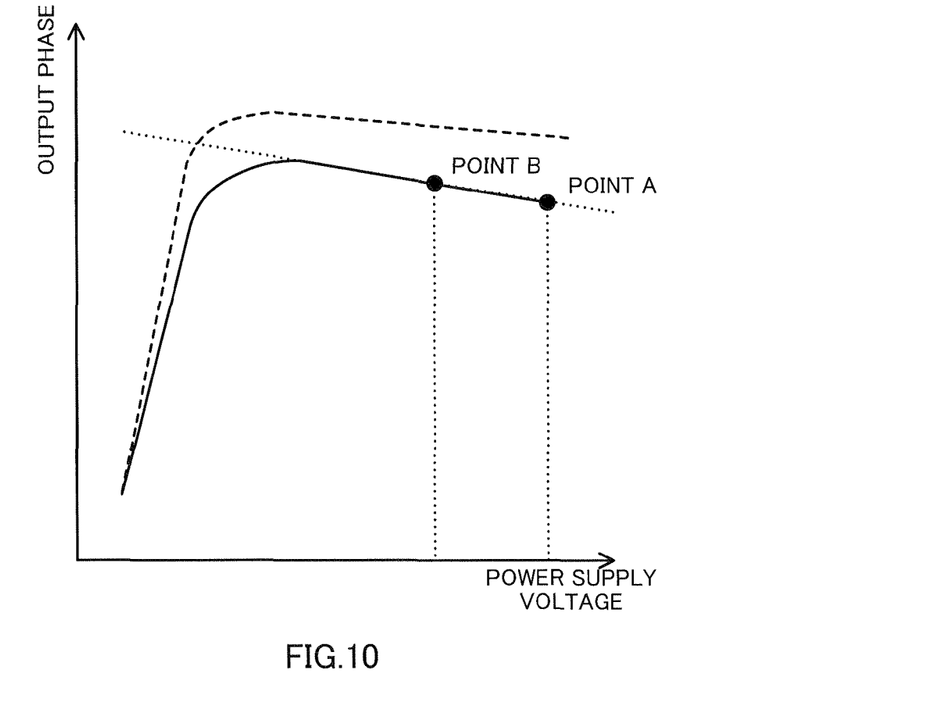
FIG. 10 illustrates phase correction operation for the case where the baseband amplitude signal of the transmission modulation apparatus according to Embodiment 2 is relatively large.

FIG. 10 illustrates phase correction operation for the case where the baseband amplitude signal is relatively large.

When the power supply voltage based on baseband amplitude signal 111 is inputted to high-frequency power amplifier 130 from power supply voltage control section 160, phase detector 210 detects the output phase corresponding to a root-mean-square value of the power supply voltage (refer to point A in FIG. 10), and, when the power supply voltage based on baseband amplitude signal 111 of a different level from that for detecting point A is inputted, phase detector 210 detects the output phase corresponding to a root-mean-square value of the power supply voltage (refer to point B in FIG. 10). Phase correcting section 220 obtains a slope from information of two points, calculates a phase to be corrected so that this slope disappears, and corrects the baseband phase signal at phase modulator 120.

Next, the phase correction operation will be described for the case where the level of baseband amplitude signal 111 is relatively small, that is, in a region where the output phase changes rapidly with respect to the power supply voltage value of high-frequency power amplifier 130.

Figure 11:
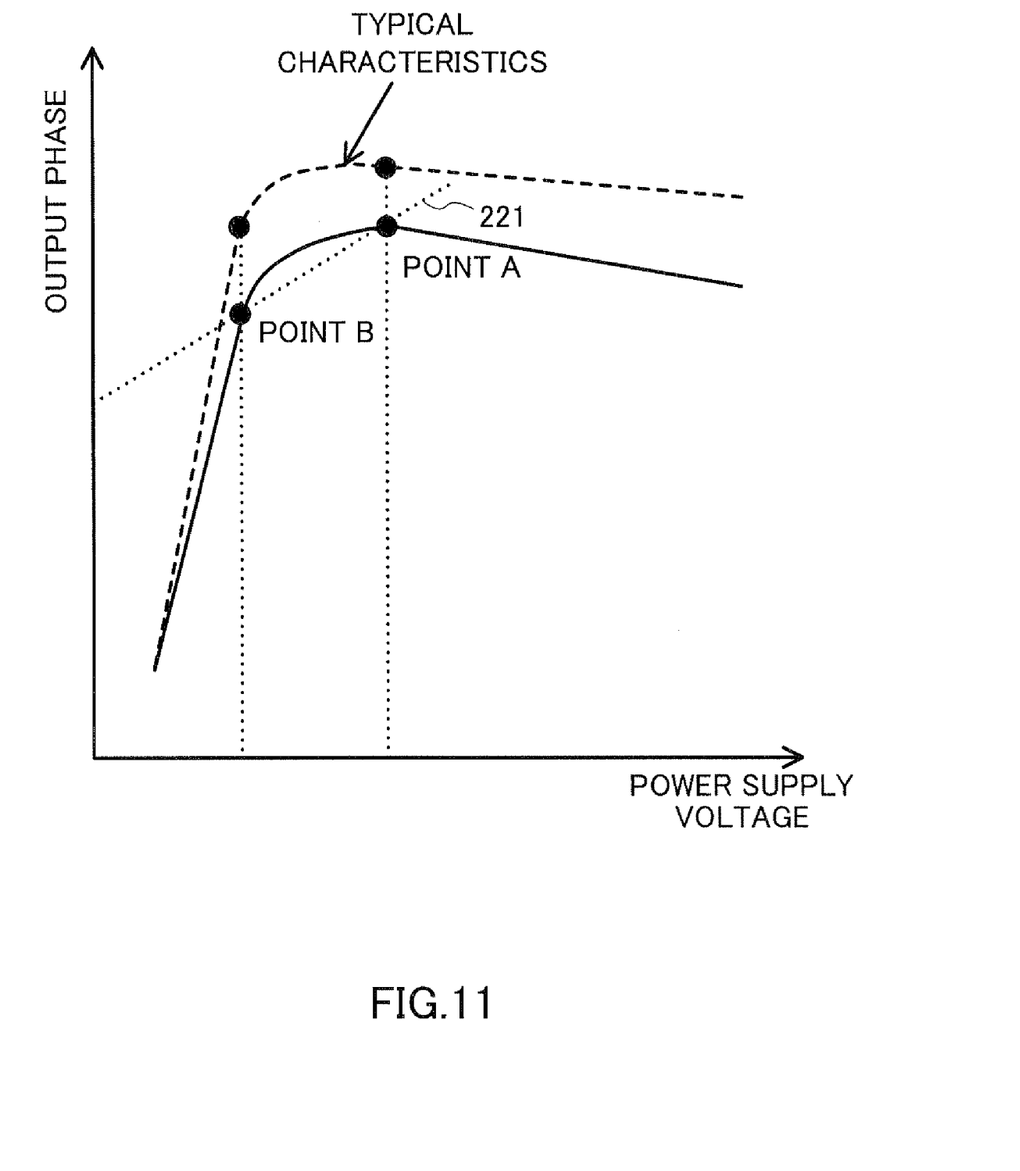
FIG. 11 illustrates phase correction operation for the case where the baseband amplitude signal of the transmission modulation apparatus according to Embodiment 2 is relatively small.

FIG. 11 illustrates phase correction operation for the case where the baseband amplitude signal is relatively small.

With correction for the case where the level of baseband amplitude signal 111 is relatively small, the slope is obtained from the output phase (refer to point A in FIG. 11) corresponding to a point (refer to point A in FIG. 4) where the relationship between the power supply voltage value and the output voltage starts to shift from a line (linear) to non-linear, and the output phase (refer to point B in FIG. 11) corresponding to a point (refer to point B in FIG. 7) where the output voltage is a minimum, and a phase to be corrected is calculated using line 221 (dashed line) including these two points. The point where the above-described output voltage is a minimum corresponds to the leakage amount of high-frequency power amplifier 130. Regarding power supply voltage values of high-frequency power amplifier 130 corresponding to these points are set from typical characteristics (refer to dashed line in FIG. 4) indicating the relationship between the power supply voltage value and the output voltage, and it is assumed that the baseband amplitude signal corresponding to this power supply voltage value is inputted.

Phase detector 210 detects the output phase corresponding to the power supply voltage where the relationship between the power supply voltage value and the output voltage of high-frequency power amplifier 130 shifts from a line (refer to point A in FIG. 11), and further detects the output phase corresponding to the power supply voltage where the output voltage is a minimum (refer to point B in FIG. 11). The power supply voltage where the relationship between the power supply voltage value and the output voltage starts to shift from a line, and the power supply voltage where the output voltage is a minimum, are set from the typical characteristics.

Phase correcting section 220 obtains a slope from information of two points, calculates a phase to be corrected so that this slope disappears, and phase modulator 120 corrects the baseband phase signal based on the corrected phase calculated by phase correcting section 220.

In this way, by measuring the leakage amount of high-frequency power amplifier 130, it is possible to compensate the relationship with the output phase, in particular, when the power supply voltage value is low. In addition, the example is given where both point A and point B are extracted from a region where the relationship between the power supply voltage value and the output voltage of high-frequency power amplifier 130 becomes non-linear, but, when the level of baseband amplitude signal 111 extends over a region where the relationship between the power supply voltage value and the output voltage of high-frequency power amplifier 130 becomes linear and a region where the relationship becomes non-linear, the output phase corresponding to the output voltage of the linear region is detected as point A, the output phase corresponding to the output voltage of the non-linear region is extracted as point B, and the phase to be corrected may then be calculated using a line including these two points.

Here, the case has been described as an example where the output phase for when baseband amplitude signal 111 is inputted to high-frequency power amplifier 130 from power supply voltage control section 160 is detected, but it is not necessary to input baseband amplitude signal 111, and it is possible to perform correction in the same way if a fixed voltage (such as a DC power supply voltage) is inputted. Further, the slope is obtained from information of two points, but it is also possible to perform compensation more accurately in accordance with an increase in the number of detecting points. In this case, it is preferable to perform approximation using a regression line. If correction is performed once, further correction is not necessary unless the use conditions of the transmission modulation apparatus change. Namely, if correction is performed when transmission modulation apparatuses are shipped from the factory, correction is not necessary as long as transmission modulation apparatuses are used based on the use conditions for the time of factory shipment. In other words, if this correction processing is executed immediately before (for example, upon supplying power) the transmission modulation apparatuses are used, correction is possible even if characteristics of high-frequency power amplifier 130 fluctuate due to changes in the use conditions (for example, temperature change).

As described above, according to this embodiment, phase correcting section 220 obtains a slope from information of two points and calculates a phase to be corrected so that this slope disappears, and phase modulator 120 corrects the baseband phase signal based on the corrected phase calculated by phase correcting section 220, so that, in addition to the effects of Embodiment 1, for the baseband phase signal, it is possible to deal with characteristic variations of high-frequency power amplifier 130 without always forming a phase adjustment loop.

In this embodiment, a configuration is adopted where a phase detection control signal, phase detector 210 and phase correcting section 220 are added to the configuration of transmission modulation apparatus 100 in FIG. 4. This is because a region where the power supply voltage value is low corresponds to the case where the voltage value of the baseband amplitude signal is small, and in the region, it is effective to correct the offset voltage correction for the baseband amplitude signal. However, a configuration where only phase detector 210 and phase correcting section 220 are provided is also possible.

Embodiment 3

A region where the power supply voltage is high is linear, and a region where the power supply voltage is low exhibits complex behavior. It can therefore be considered that, in the region where the power supply voltage is lower than a predetermined voltage, accuracy is further improved by maintaining this loop in an always operating state. In Embodiment 3, level detection control section 310 is provided, and the always operating state is maintained where the power supply voltage is low.

Figure 12:
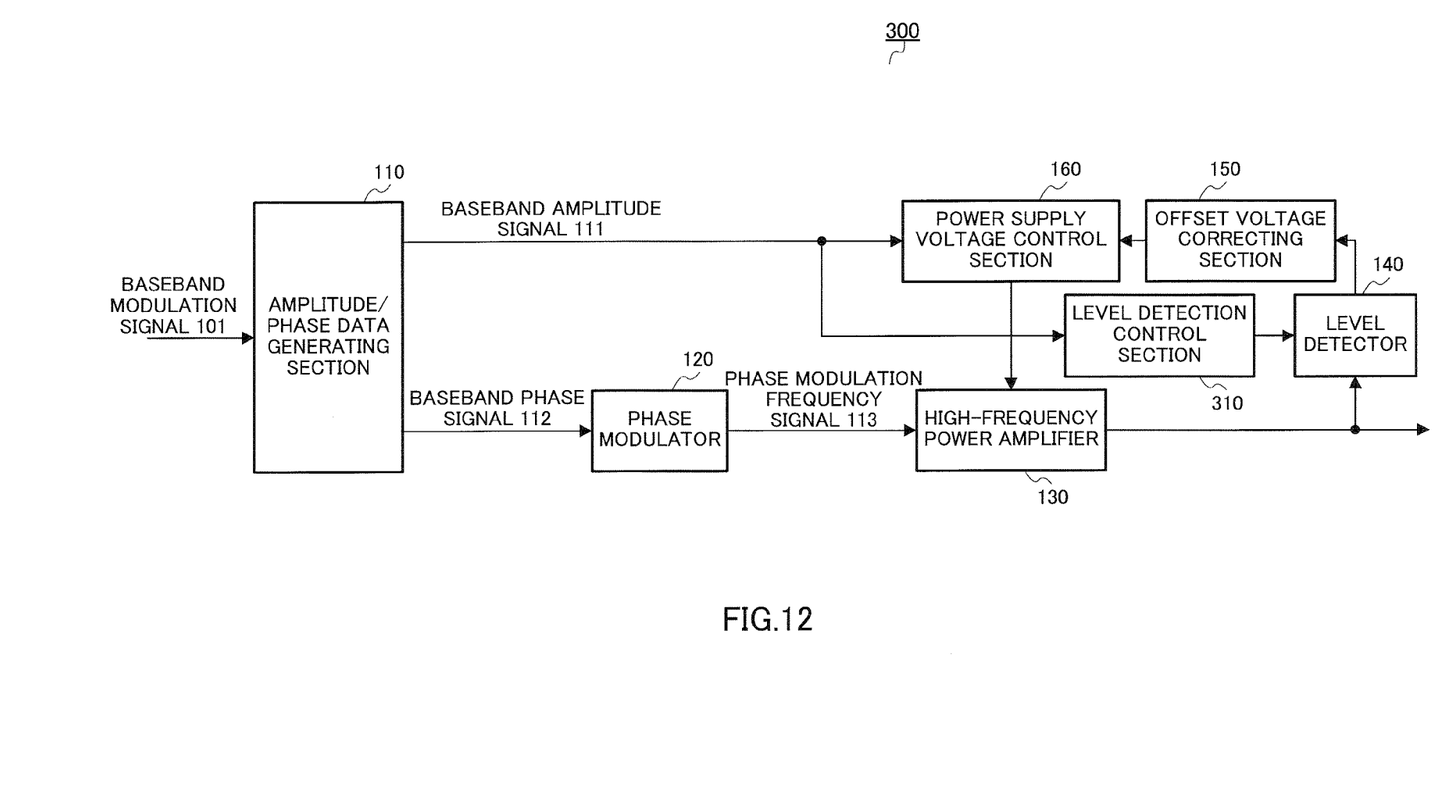
FIG. 12 is a block diagram showing a configuration of a transmission modulation apparatus according to Embodiment 3 of the present invention.

FIG. 12 is a block diagram showing a configuration of the transmission modulation apparatus according to Embodiment 3 of the present invention. Components that are the same as those in FIG. 4 will be assigned the same reference numerals without further explanations.

In FIG. 12, transmission modulation apparatus 300 is configured with level detection control section 310 that controls level detector 140 based on baseband amplitude signal 111 in addition to the configuration of transmission modulation apparatus 100 of FIG. 4.

Level detection control section 310 outputs a control signal for controlling level detector 140 to be operable when baseband amplitude signal 111 having an root-mean-square value corresponding to a power supply voltage less than a predetermined value is inputted.

Level detector 140 detects the output signal level of high-frequency power amplifier 130 based on the output of level detection control section 310.

Hereinafter, the operation of the transmission modulation apparatus configured as described above will be described.

Figure 13:
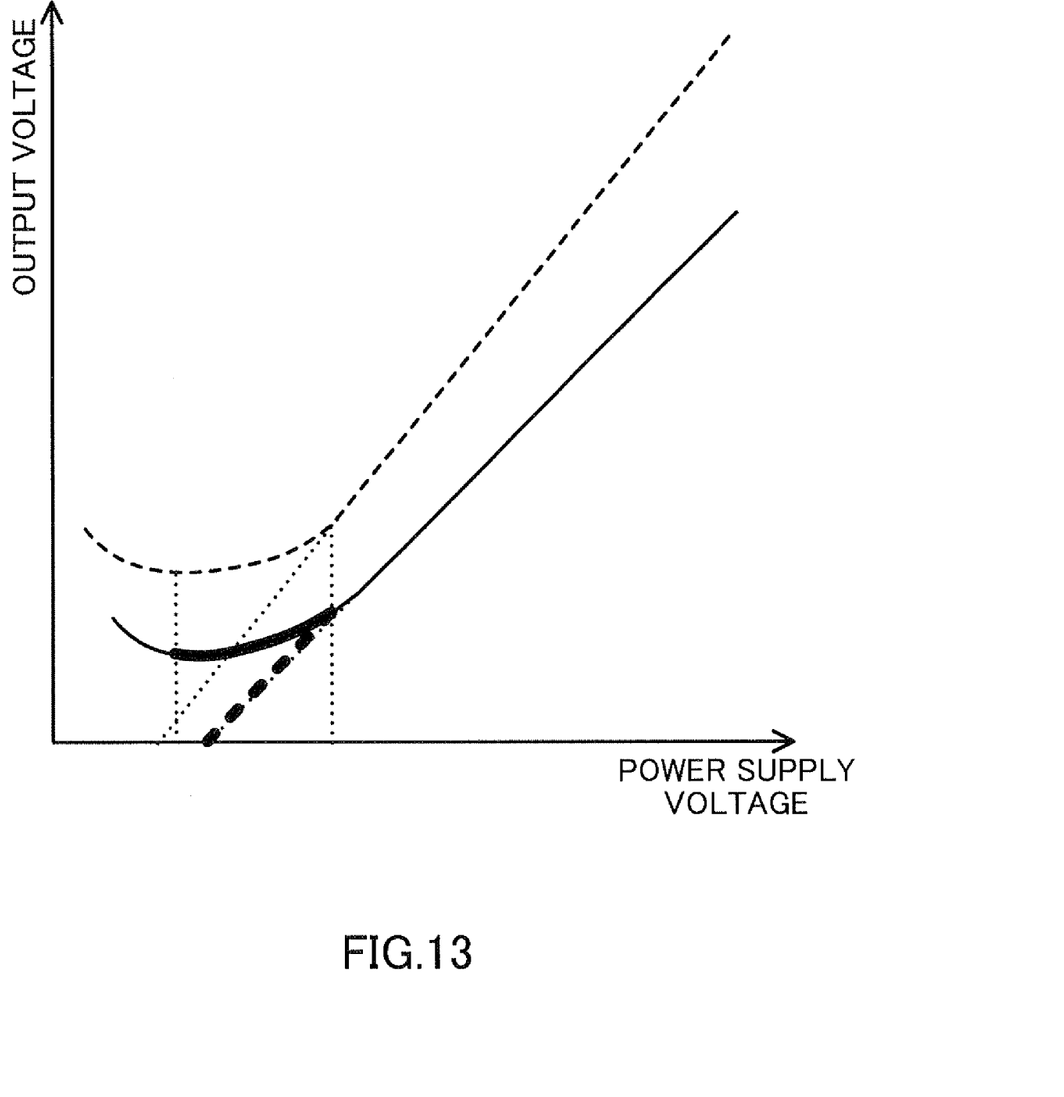
FIG. 13 illustrates offset voltage correction operation for the case where the baseband amplitude signal of the transmission modulation apparatus according to Embodiment 3 is relatively small.

FIG. 13 illustrates offset voltage correction operation for the case where the baseband amplitude signal is relatively small.

When baseband amplitude signal 111 having an root-mean-square value less than a given value, more specifically, a root-mean-square value corresponding to a value less than a power supply voltage (set from the typical characteristics) for when the relationship between the power supply voltage value and the output voltage of high-frequency power amplifier 130 starts to shift from a line, is inputted, level detection control section 310 controls level detector 140 and corrects the offset voltage.

Level detector 140 detects the output voltage (thick solid line portion) for when baseband amplitude signal 111 having a root-mean-square value corresponding to a value less than the power supply voltage where the relationship of the power supply voltage value and the output voltage starts to shift from a line. Offset voltage correcting section 150 calculates a voltage for making the relationship between the voltage value of the baseband amplitude signal corresponding to the thick solid line portion and the output voltage proportional, and corrects the offset voltage set by power supply voltage control section 160.

It is therefore possible to accurately compensate the relationship with the output voltage, in particular, when the power supply voltage value is low by measuring the output voltage less than the power supply voltage when the relationship between the power supply voltage value and the output voltage of high-frequency power amplifier 130 starts to shift from a line.

This embodiment is suitable for the case of accurately dealing with characteristic variations of high-frequency power amplifier 130 when the relationship between the power supply voltage value and the output voltage of high-frequency power amplifier 130 is compensated. Other aspects are the same as for Embodiment 1.

This compensation method may also be applied to correction of the phase signal described in Embodiment 2. In this case, the method is different from the method of obtaining the slope of a line from information of two points described in Embodiment 1, and it is possible to achieve linearity in line with the maximum slope at portions shown by the thick line shown in FIG. 13. Namely, it is possible to achieve linearity using the same slope as the slope in the region where the output voltage can be regarded as substantially fixed with respect to the power supply voltage value of high-frequency power amplifier 130, and therefore the gain of the output voltage with respect to the power supply voltage value does not change. Further, in FIG. 12, an amplitude loop is formed, but this differs from the case where the loop is always operating as in the related art example of FIG. 3, and the operation only needs to be performed in the low output region, and therefore configuration is relatively simple.

The above description is an example of the preferred embodiments of the present invention, and the present invention is not limited to this. The present invention can be implemented using various other embodiments without deviating from the gist of the invention.

Further, in this embodiment, the title of transmission modulation apparatus is used, but this is for simplicity of description, and power amplifier, transmission apparatus, wireless communication system, or the like may also be used.

In this way, according to the present invention, by measuring the leakage amount of the high-frequency power amplifier, and, in particular, compensating linearity between the voltage value of the baseband amplitude signal and the output voltage of the high-frequency power amplifier when the voltage value of the baseband amplitude signal is low, it is possible to deal with characteristic variations of the high-frequency power amplifier without always forming an amplitude loop.

Therefore, the transmission modulation apparatus of the present invention provides an advantage of dealing with characteristic variations of the high-frequency power amplifier without always forming an amplitude loop by measuring the leakage amount of the high-frequency power amplifier and compensating linearity with the output voltage, in particular, when the voltage value of the baseband amplitude signal is low, and is suitable for being applied to the radio transmission equipment or the like of the polar modulation scheme.

What is claimed is:

1. A transmission modulation apparatus comprising:
    an amplitude/phase data generating section that generates a baseband amplitude signal and a baseband phase signal;
    a phase modulator that phase-modulates a high-frequency signal using the baseband phase signal;
    a high-frequency power amplifier that amplifies an output signal of the phase modulator based on an output signal from a power supply voltage control section;
    the power supply voltage control section that calculates a power supply voltage value for controlling a power supply voltage of the high-frequency power amplifier based on the baseband amplitude signal, adds a predetermined offset voltage to the power supply voltage value, and outputs the result to the high-frequency amplifier as the output signal;
    a determining section that determines from execution conditions whether or not offset voltage correction for correcting the offset voltage is performed; and
    an offset voltage correcting section that, when the offset voltage correction is determined to be performed by the determining section, corrects the offset voltage using a first line, obtained by collinear approximation in a region where a relationship between the power supply voltage and an output voltage of the high-frequency power amplifier is non-linear, having a different slope from a slope of a second line in a region where the relationship is linear.

2. The transmission modulation apparatus according to claim 1, wherein the determining section determines that the output signal level of the high-frequency power amplifier is less than a predetermined voltage.

3. The transmission modulation apparatus according to claim 1, wherein the determining section determines the high-frequency power amplifier output voltage where the relationship between the power supply voltage and the high-frequency power amplifier output voltage starts to shift from linear to non-linear.

4. The transmission modulation apparatus according to claim 1, wherein the determining section determines a temperature change of the high-frequency power amplifier.

5. The transmission modulation apparatus according to claim 1, wherein the determining section determines a usage time, energized time or power supply timing.

6. The transmission modulation apparatus according to claim 1, wherein the offset voltage correcting section corrects the offset voltage using the first line obtained by the collinear approximation and including a first point extracted from the region where the relationship is linear and a second point extracted from a region ranging from where the relationship starts shifting from linear to non-linear to where the high-frequency power amplifier output voltage is a minimum.

7. The transmission modulation apparatus according to claim 1, wherein the offset voltage correcting section corrects the offset voltage using the first line obtained by the collinear approximation and including a first point where the relationship starts shifting from linear to non-linear and a second point where the high-frequency power amplifier output voltage is a minimum in the region where the relationship is non-linear.

8. A transmission modulation apparatus comprising:
an amplitude/phase data generating section that generates a baseband amplitude signal and a baseband phase signal;
a phase modulator that phase-modulates a high-frequency signal using the baseband phase signal;
a high-frequency power amplifier that amplifies an output signal of the phase modulator;
a power supply voltage control section that calculates a power supply voltage value for controlling a power supply voltage of the high-frequency power amplifier based on the baseband amplitude signal;
a determining section that determines from execution conditions whether or not phase correction for correcting a phase of the baseband phase signal is performed; and
a phase correcting section that, when the phase correction is determined to be performed by the determining section, corrects the phase of the baseband phase signal using a first line, obtained by collinear approximation in a region where a relationship between the power supply voltage and an output phase of the high-frequency power amplifier is non-linear, having a different slope from a slope of a second line in a region where the relationship is linear.

9. The transmission modulation apparatus according to claim 8, wherein the phase correcting section corrects the phase of the baseband phase signal using the first line obtained by the collinear approximation and including a first point, the first point being the output phase of the high-frequency power amplifier corresponding to an output voltage of the high-frequency power amplifier in the region where the relationship between the power supply voltage and the output voltage of the high-frequency power amplifier is linear, and a second point, the second point being the output phase of the high-frequency power amplifier corresponding to the output voltage of the high-frequency power amplifier in a region ranging from where the relationship between the power supply voltage and the output voltage of the high-frequency power amplifier starts shifting from linear to non-linear to where the output voltage of the high-frequency power amplifier is a minimum.

10. The transmission modulation apparatus according to claim 8, wherein the phase correcting section corrects the phase of the baseband phase signal using the first line obtained by the collinear approximation and including a first point, the first point being the output phase of the high-frequency power amplifier corresponding to a point where the relationship between the power supply voltage and an output voltage of the high-frequency power amplifier starts shifting from linear to non-linear, and a second point, the second point being the output phase of the high-frequency power amplifier corresponding to a point where the output voltage of the high-frequency power amplifier is a minimum in a region where the relationship between the power supply voltage and the output voltage of the high-frequency power amplifier is non-linear.

* * * * *